(12) United States Patent  (10) Patent No.: US 8,778,796 B2
Lin  (45) Date of Patent: Jul. 15, 2014

(54) MULTILAYER LINE TRIMMING

(71) Applicant: Macronix International Co., LTD, Hsinchu (TW)

(72) Inventor: Lo Yueh Lin, Yilan County (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 13/648,792

(22) Filed: Oct. 10, 2012

(65) Prior Publication Data

US 2014/0097541 A1    Apr. 10, 2014

(51) Int. Cl.
*H01L 21/44*    (2006.01)
(52) U.S. Cl.
USPC ............................................. 438/630; 438/647

(58) Field of Classification Search
USPC .................. 257/754; 438/630, 647, 655, 657
See application file for complete search history.

(56) References Cited

U.S. PATENT DOCUMENTS 8,643,142 B2 *    2/2014  Higashitani et al. .......... 257/533

* cited by examiner

*Primary Examiner* — Roy Potter
(74) *Attorney, Agent, or Firm* — Baker & McKenzie LLP

(57) ABSTRACT

Substantially simultaneous plasma etching of polysilicon and oxide layers in multilayer lines in semiconductors allows for enhanced critical dimensions and aspect ratios of the multilayer lines. Increasing multilayer line aspect ratios may be possible, allowing for increased efficiency, greater storage capacity, and smaller critical dimensions in semiconductor technologies.

12 Claims, 7 Drawing Sheets

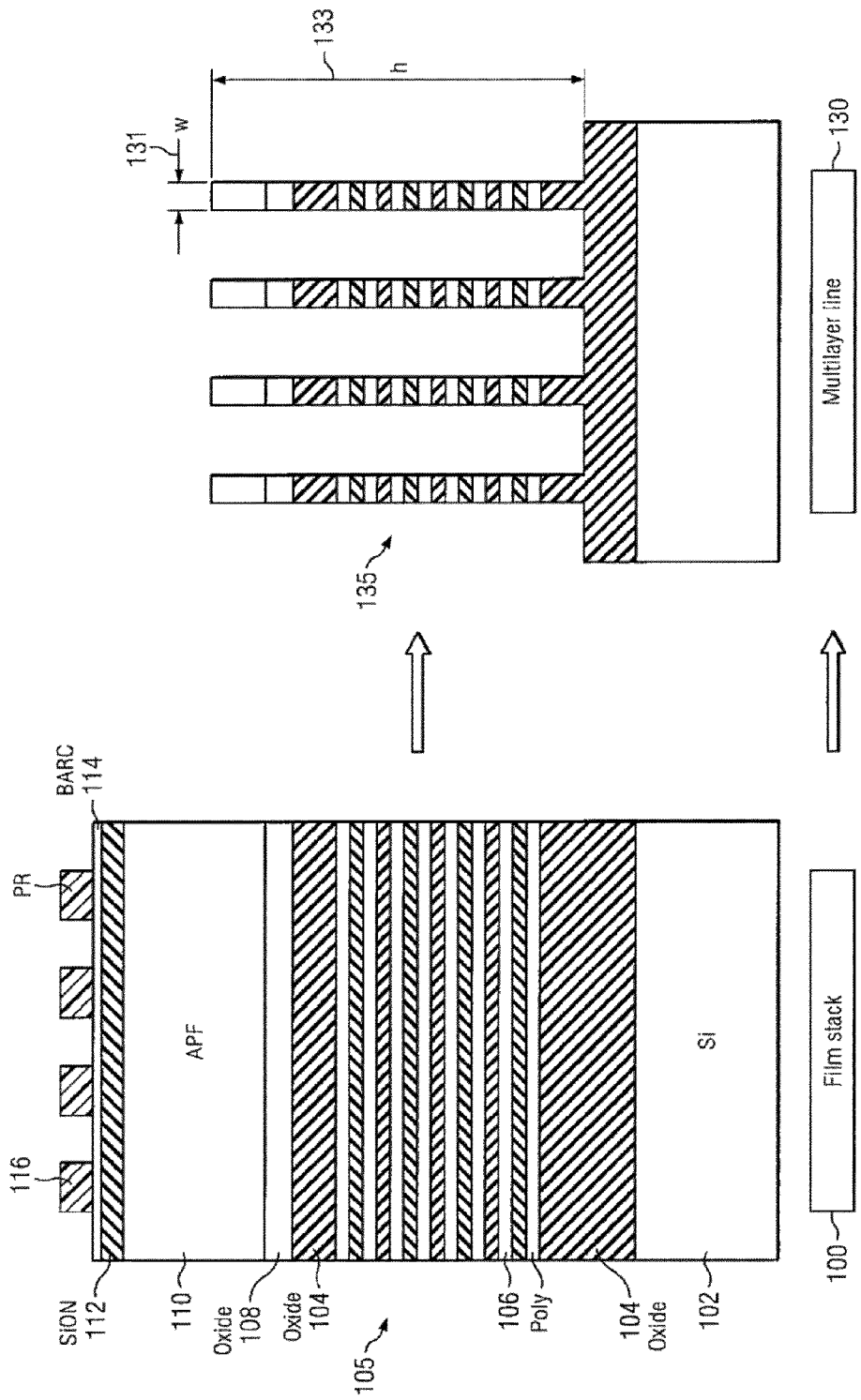

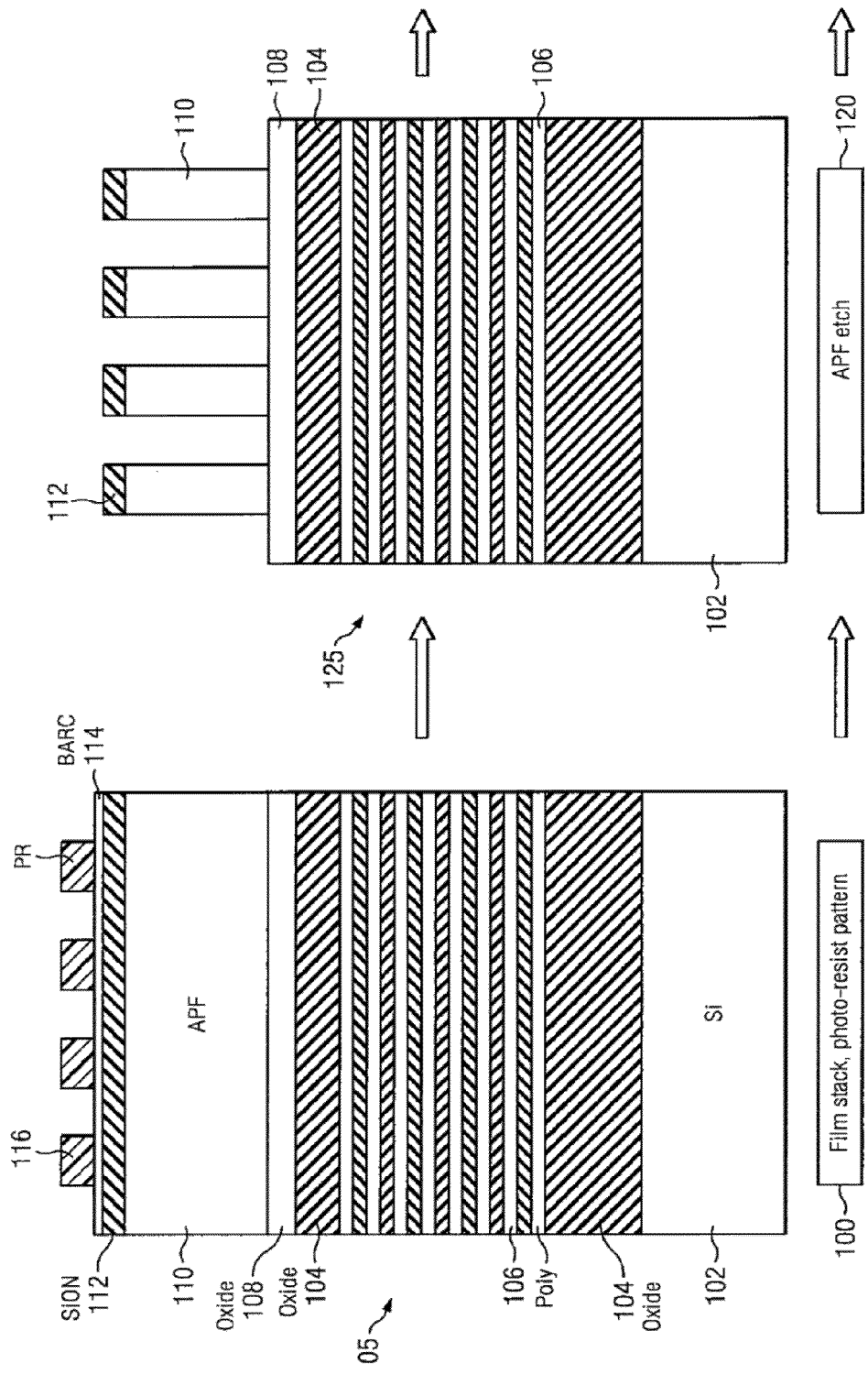

30 CF4

25 CF4

20 CF4

MULTILAYER LINE TRIMMING

TECHNICAL FIELD

The present application relates generally to multilayer line semiconductor technology and, more specifically, relates to trimming multilayer lines and semiconductor devices with trimmed multilayer lines.

BACKGROUND

Critical dimensions of memory devices in semiconductor devices are ever shrinking. And three-dimensional (3D) memory devices are one way designers have achieved greater storage capacity while making dimensions small, but to increase efficiency of such memory devices even smaller critical dimensions of oxide/poly multilayer lines as bit lines of 3D memory are desired.

Current techniques for forming multilayer lines of 3D memory typically use photo resist to form a desired pattern in an advanced patterning film (APF) layer, which is then used to etch polysilicon and oxide layers formed beneath the APF layer on a device substrate. The desired pattern in the APF layer typically includes spaced apart regions of APF material, and the regions of APF material are then used to pattern the multilayer lines. Thus, the dimensions of the current multilayer lines of 3D memory are defined by the dimensions of the spaced apart regions of the patterned APF layer, decreasing the width of the spaced apart regions of the APF material will allow for a smaller critical dimensioned multilayer lines of 3D memory.

3D memory multilayered lines typically comprise a plurality of alternating silicon oxide and poly-silicon layers. Each layer has a thickness of approximately 5000 Å. Typically, an advanced patterning film (APF) of approximately 6000 Å may be used to resist etching chemicals when etching the multilayered silicon oxide and poly-silicon layers. But the advanced patterning film (APF) layer is typically made of amorphous carbon, which is a relatively soft material. And this material is susceptible to falling apart or deteriorating when its aspect ratio is too large (e.g., aspect ratio >7). Besides, a thin patterned APF will suffer corner damage. Problems with the APF could compromise the later processing or etching of the multilayer lines of 3D memory. Accordingly, there are limits to how small the spaced apart regions of the APF layer may be, and so there are also limits as to how small the critical dimensions of the multilayer lines of 3D memory formed using a patterned APF layer approach may be.

Thus, it is desirable to find a new approach for decreasing the critical dimension of multilayer lines of 3D memory.

SUMMARY

Disclosed herein are methods for trimming multilayer lines of 3D memory and devices including trimmed multilayer lines.

According to an aspect, a semiconductor memory device has a multilayer line with a height and a width, and the ratio of the height to width is in the range of approximately 5-12. The multilayer line may be made of alternating layers of polysilicon and oxide, and each layer of the multilayer line may have a thickness in the range of approximately 200-400 Å.

According to another aspect, the multilayer line may be formed by trimming an etched multilayer line using a plasma, and alternating layers of polysilicon and oxide may be substantially simultaneously trimmed using the plasma. The layers of polysilicon and oxide may be trimmed at substantially the same etching rate, and wherein width variation between adjacent oxide and polysilicon layers is less than approximately 5 nm.

According to another aspect, forming a multilayer line of a memory device may include placing an etched multilayer line having alternating layers of polysilicon and oxide in an etching chamber and trimming the etched multilayer line using a plasma having a bias power in the range of substantially 0 W and a ratio of $O_2$ to $CF_4$ in the range of approximately 0-20.

The alternating layers of polysilicon and oxide may be etched to form the etched multilayer line. And trimming the etched multilayer line using the plasma may further include generating a trimmed multilayer line having a height and a width, wherein the ratio of the height to the width is in the range of approximately 12-17. The alternating layers of polysilicon and oxide may be trimmed substantially simultaneously.

According to another aspect, forming a semiconductor memory device may include generating a trimmed multilayer line by substantially simultaneously trimming alternating layers of polysilicon and oxide of an etched multilayer line using a plasma. Trimming the alternating layers of polysilicon and oxide may include trimming the lateral edges of the alternating polysilicon and oxide layers of the etched multilayer line. The alternating layers of polysilicon and oxide of the etched multilayer line may include vertical trimming in the range of approximately 10-15 nm of the etched multilayer line.

According to another aspect, the plasma has a bias power in the range of substantially 0 W and a ratio of $O_2$ to $CF_4$ in the range of approximately 0-20.

According to another aspect, the etched multilayer line may have a first height and a first width, and the trimmed multilayer line may have a second height and a second width. A first ratio of the first height to the first width is less than a second ratio of the second height to the second width. The second ratio may be in the range of approximately 12-17.

According to another aspect, substantially simultaneously trimming the alternating layers of polysilicon and oxide includes etching the alternating layers of polysilicon and oxide at substantially the same etching rate, which results in the etched multilayer line having substantially smooth sidewalls.

BRIEF DESCRIPTION OF THE DRAWINGS

Features, aspects, and embodiments of the inventions are described in conjunction with the attached drawings, in which:

FIGS. 1A and 1B are schematic diagrams illustrating generating etched multilayer lines of 3D memory, in accordance with the present disclosure;

FIGS. 2A through 2D are schematic diagrams illustrating trimming multilayer lines of 3D memory, in accordance with the present disclosure;

DETAILED DESCRIPTION

Figure 2D:
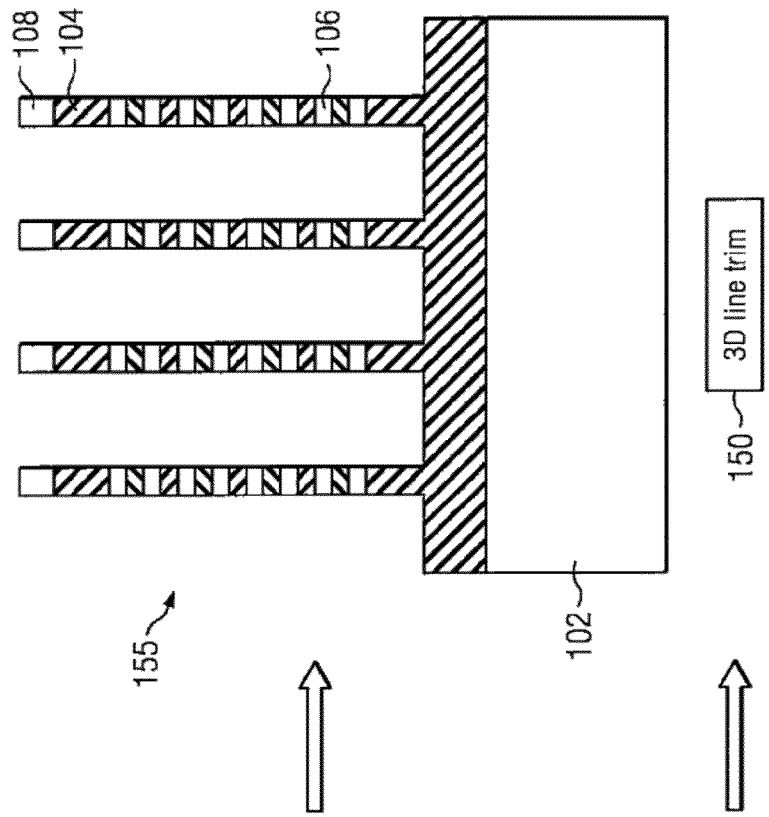
Figure 2C:
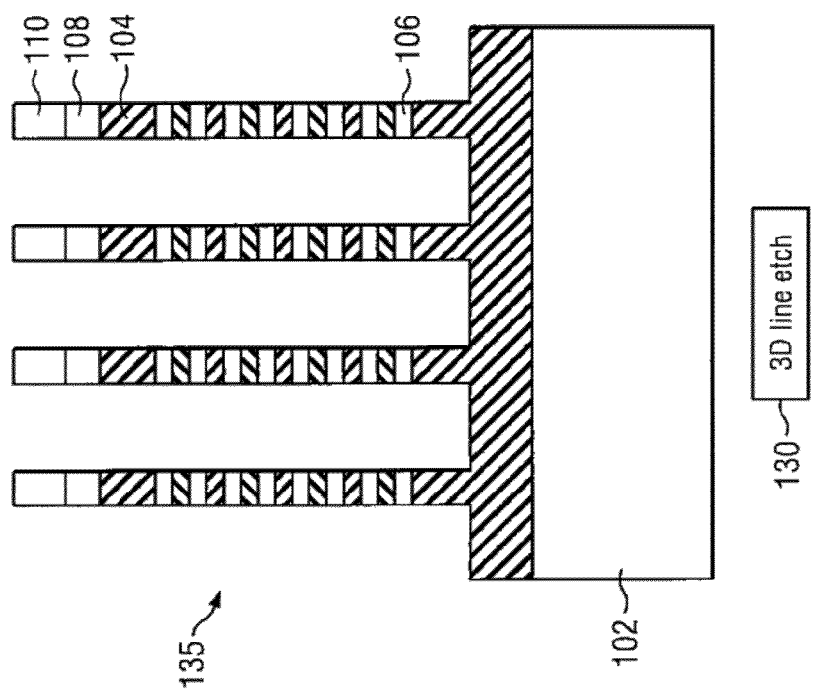

FIGS. 1A and 1B are schematic diagrams illustrating generating etched 3D multilayer lines 135 from a memory film multilayer 105. The memory film multilayer 105 includes a substrate 102, alternating oxide layers 104 and polysilicon layers 106, a secondary oxide layer 108, an advanced patterning film (APF) layer 110, an etch-stop layer 112, a back anti-reflective coating layer 112, and a photo resist layer 116. In an embodiment, the etch-stop layer 112 may be made of SiON, and the substrate may be made of Si. The photo resist layer 116 may be patterned based on a desired profile for the etched 3D multilayer lines 135.

The etched 3D multilayer lines 135 are generated from the film multilayer 105 through a series of steps including providing or generating the memory film multilayer (action 100) and etching the various layers to generate the etched 3D multilayer lines (action 130). This is a highly simplified description of the process for generating the etched 3D multilayer lines, which will also include, but is not limited to, etching the APF layer 110 and etch-stop layer 112 using the patterned photo resist layer 116, resulting in a patterned APF layer 110 also based on the desired profile for the etched 3D multilayer lines 135, and using an etching species formulated for a particular layer to etch the alternating layers of polysilicon and oxide by layer, forming the etched 3D multilayer lines 135.

As discussed, the dimensions of the etched 3D multilayer lines 135 are defined by the dimensions of the patterned APF layer, and the APF layer material is susceptible to falling apart or deteriorating when the width of the spaced apart regions is too small. Thus, there are limits to how narrow the critical dimensions of the etched 3D multilayer lines 135 may be. For example, the etched 3D multilayer lines 135 have a first height 133 and a first width 131, and a first ratio of the first height to the first width of an etched 3D multilayer line 135 is typically less than 12. It is desirable to increase this first ratio by making the 3D multilayer lines as long in the vertical direction (i.e., increasing the first height 133) as possible while making them as narrow in the lateral direction as possible (i.e., decreasing the first width 131).

FIGS. 2A, 2B, 2C, and 2D are schematic diagrams illustrating trimming an etched 3D multilayer line 135 resulting in a trimmed 3D multilayer line 155. The memory film multilayer 105 includes a substrate 102, alternating oxide layers 104 and polysilicon layers 106, a secondary oxide layer 108, an advanced patterning film (APF) layer 110, an etch-stop layer 112, a back anti-reflective coating layer 112, and a photo resist layer 116. The photo resist layer 116 may be patterned based on a desired profile for the etched 3D multilayer lines 135.

The trimmed 3D multilayer lines 155 are generated from the film multilayer 105 through a series of steps including providing or generating the memory film multilayer (action 100); etching the APF layer 110 using the patterned photo resist layer 116, resulting in a patterned APF layer 110 also based on the desired profile for the etched 3D multilayer lines 135 (action 120); etching the various layers to generate the etched 3D multilayer lines (action 130); and trimming the etched 3D multilayer lines, resulting in trimmed 3D multilayer lines (action 150). The process may include other actions as discussed above in relation to FIG. 1 and may also include, but is not limited to, providing a substrate, forming alternating layers of polysilicon and oxide on the substrate, forming a secondary oxide layer over the alternating layers of polysilicon and oxide, forming an advanced patterning film (APF) layer over the secondary oxide layer, forming a SiON layer over the APF layer, forming a BARC layer over the SiON layer, forming a photo resist layer over the SiON layer, and patterning the photo resist layer based on a desired etched 3D multilayer line profile.

Trimming the etched 3D multilayer line (action 150) may include using a plasma having a bias power in the range of substantially 0 W and a ratio of $O_2$ to $CF_4$ in the range of ~0-20. Such parameters allows the plasma etchant to trim the alternating polysilicon and oxide layers of the etched 3D multilayer line substantially simultaneously. In an embodiment, substantially simultaneously trimming the layers means that the same plasma etchant is used to trim each of the alternating polysilicon and oxide layers of the etched 3D multilayer line.

In an embodiment, trimming the etched 3D multilayer line (action 150) may trim the oxide and polysilicon layers at substantially the same etching rate, resulting in a substantially smooth side wall of the 3D multilayer line. In some embodiments, the width variation between adjacent oxide and polysilicon layers is approximately 5 nm.

Such parameters may also allow the plasma etchant to trim the lateral edges of the alternating polysilicon and oxide layers of the etched 3D multilayer line, while minimizing any vertical trimming of the etched 3D multilayer line, thereby increasing the ratio of the 3D multilayer line height to its width. In an embodiment, trimming the etched 3D multilayer line results in a ratio of 3D multilayer line height to width in the range of ~12-17.

Figure 3A:
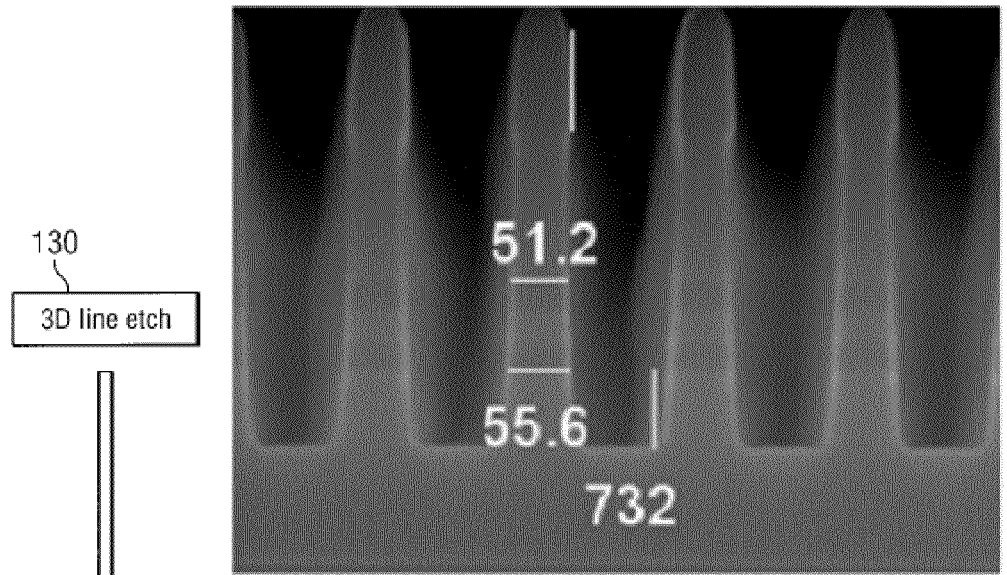
FIGS. 3A and 3B are schematic diagrams illustrating a comparison between an etched multilayer line of 3D memory and a trimmed multilayer line of 3D memory, in accordance with the present disclosure.
Figure 3B:
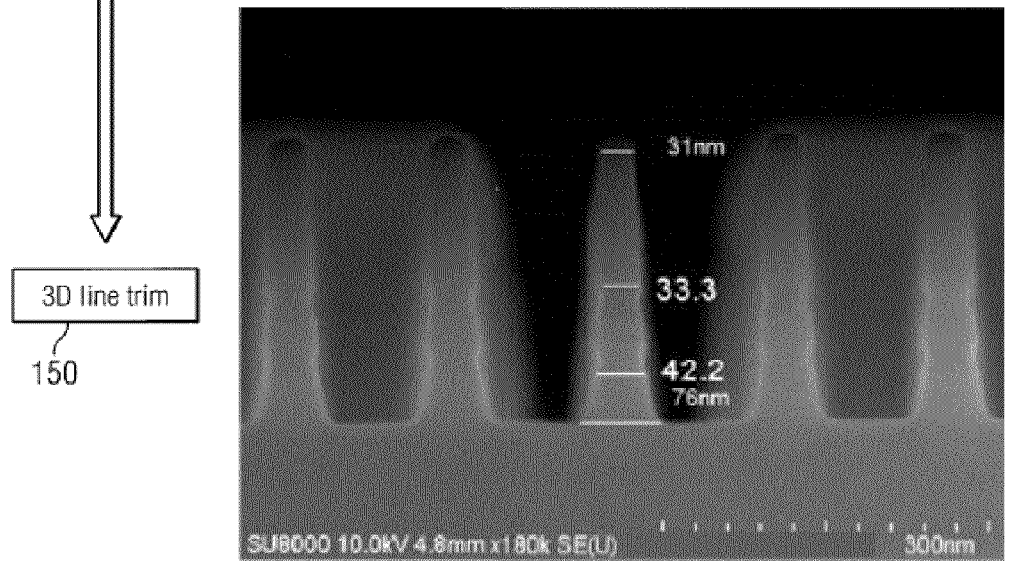

FIGS. 3A and 3B are schematic diagrams illustrating a comparison between an etched 3D multilayer line 139 and a trimmed 3D multilayer line 159 resulting from the process and parameters of FIGS. 2A-D. The various layers of a memory film multilayer are etched to generate the etched 3D multilayer lines 139 (action 130); and the etched 3D multilayer lines are trimmed, resulting in trimmed 3D multilayer lines 159 (action 150). In this embodiment, the etched 3D multilayer lines 139 have a width of ~55.6 nm toward the bottom and ~51.2 nm toward the top, and the height of the 3D multilayer lines is ~292 nm. In contrast, the trimmed 3D multilayer lines 159 have a width of ~42.4 nm toward the bottom and ~33.3 nm toward top. Accordingly, the width of the 3D multilayer lines is less after the trimming (at action 150).

Figure 4A:
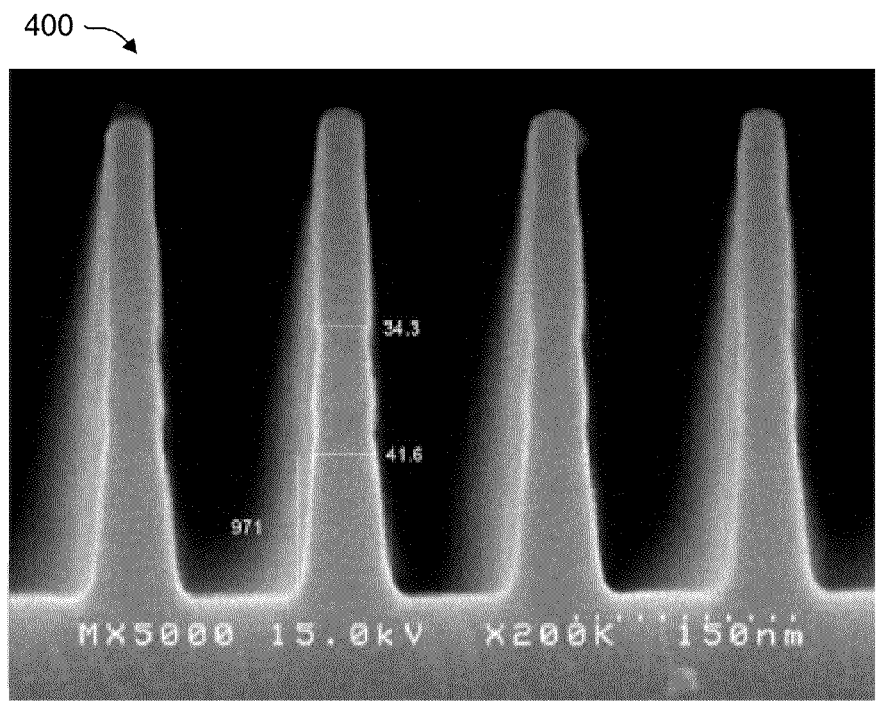
FIGS. 4A, 4B, and 4C are a schematic diagrams illustrating various exemplary trimmed multilayer lines of 3D memory, in accordance with the present disclosure.
Figure 4B:
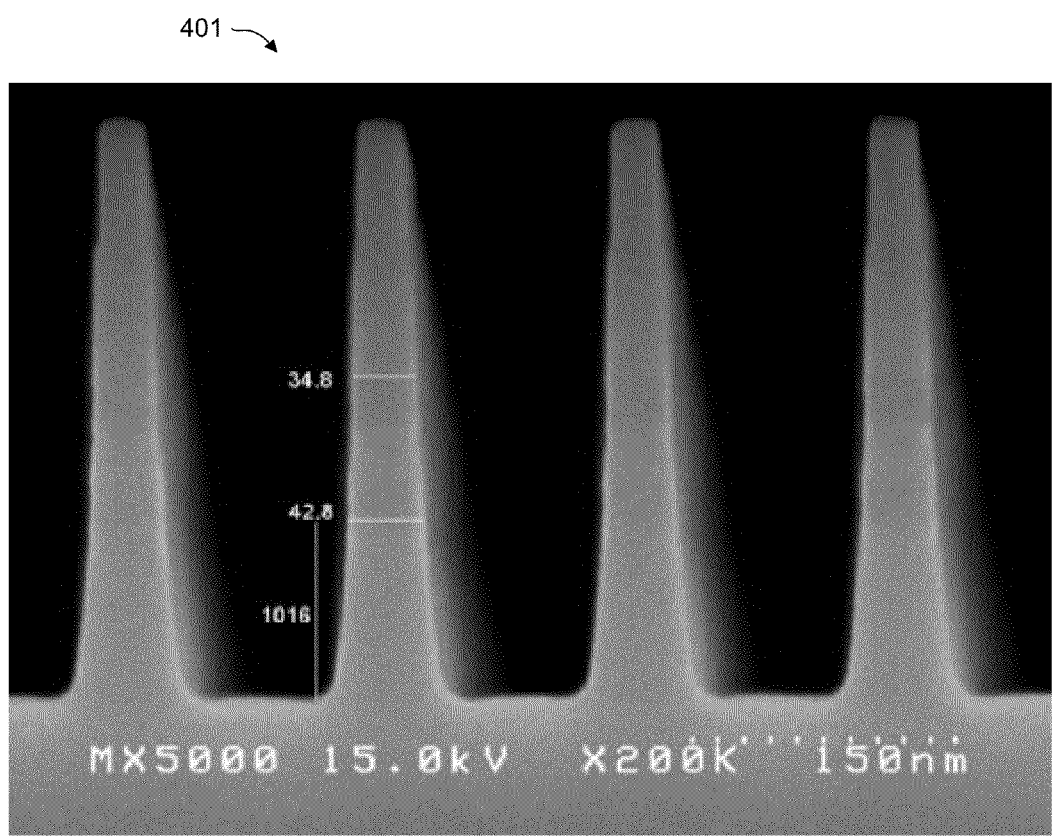
Figure 4C:
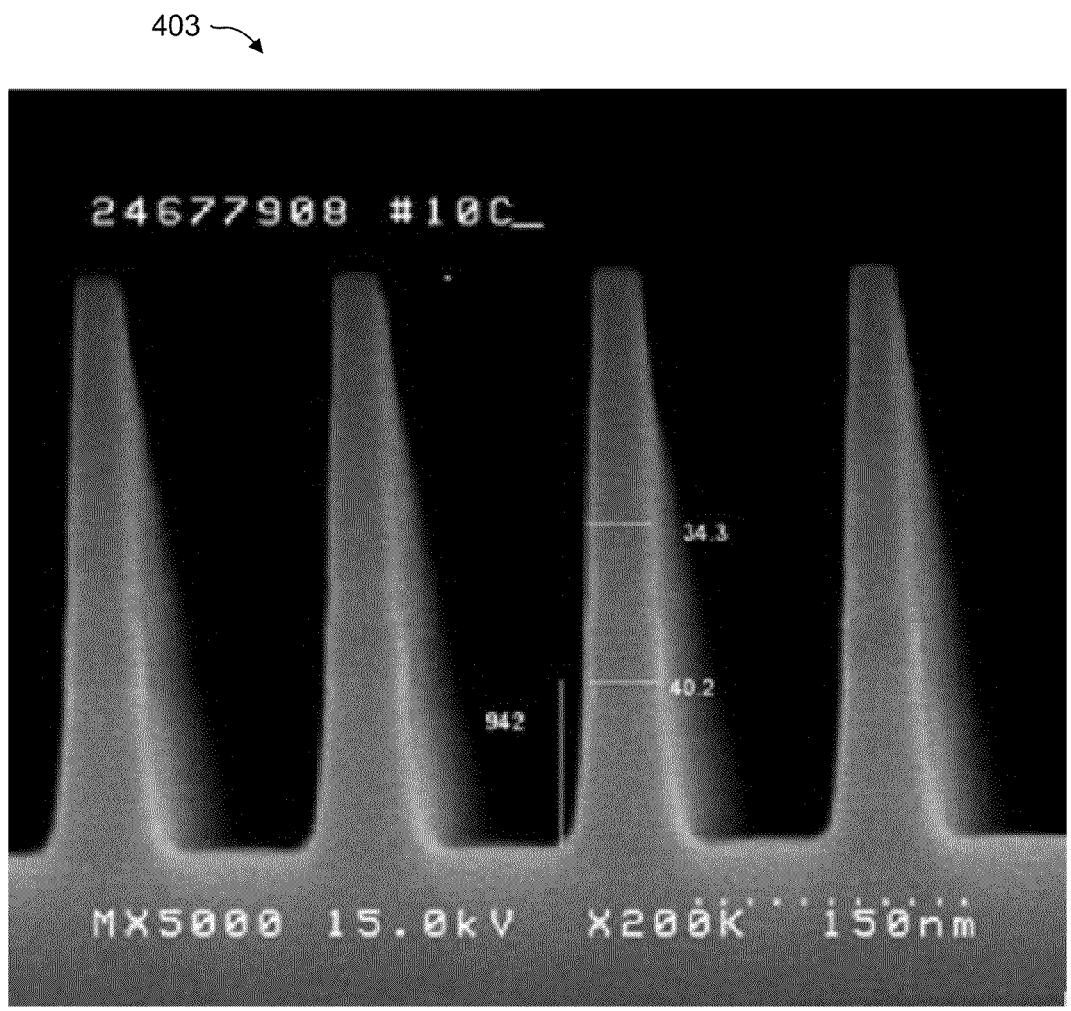

FIGS. 4A, 4B, and 4C are schematic diagrams illustrating various exemplary trimmed 3D multilayer lines 400, 401, and 403, respectively. The 3D multilayer lines have been trimmed using various values of $CF_4$ yielding various widths for the trimmed 3D multilayer lines.

For example, referring first to FIG. 4A, the 3D multilayer lines were trimmed using a plasma having 30 sccm of $CF_4$. The resulting trimmed 3D multilayer lines 400 have a height to width ratio of ~21 nm.

Referring now to FIG. 4B, the 3D multilayer lines were trimmed using a plasma having 25 sccm of $CF_4$. The resulting trimmed 3D multilayer lines 401 have a height to width ratio of ~23 nm.

Referring now to FIG. 4C, the 3D multilayer lines were trimmed using a plasma having 20 sccm of $CF_4$. The resulting trimmed 3D multilayer lines 403 have a height to width ratio of ~23.5 nm.

Figure 5:
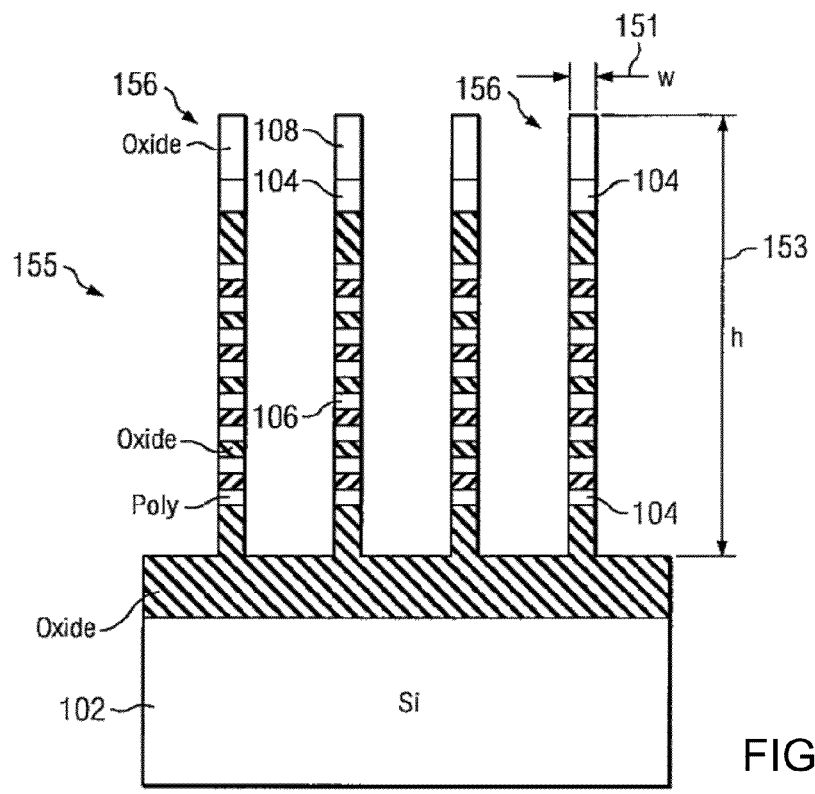
FIG. 5 is a schematic diagram illustrating a cross-sectional view of a memory device having trimmed multilayer lines of 3D memory, in accordance with the present disclosure.

FIG. 5 is a schematic diagram illustrating a cross-sectional view of a memory device 155 with trimmed 3D multilayer lines 156. The memory device 155 includes a substrate 102, alternating oxide layers 104 and polysilicon layers 106, and a secondary oxide layer 108. In an embodiment, the substrate may be made of Si.

The trimmed 3D multilayer lines may be formed as discussed above. For example, a photo resist layer (not shown) may be patterned based on a desired profile for etched 3D multilayer lines (not shown), which are generated from an original film multilayer through a series of steps including providing or generating the memory film multilayer and etching the various layers to generate the etched 3D multilayer lines. The etched 3D multilayer lines have a first height and a first width (e.g., 133, 131 in FIG. 1). The etched 3D multilayer lines are trimmed resulting in the trimmed 3D multilayer lines 156 having a second height and a second width.

In an embodiment, a second ratio of the second height 153 to the second width 151 of the trimmed 3D multilayer lines is in the range of ~12-17. In an exemplary embodiment, the second ratio is ~15. In an embodiment, a first ratio of the first height 133 to the first width 131 of an etched 3D multilayer line (shown in FIG. 1) is less than a second ratio of the second height 153 to the second width 151 (shown in FIG. 5).

The trimmed 3D multilayer line may be formed by trimming an etched 3D multilayer line using a plasma having various parameters (as discussed above in relation to FIGS. 2A-D, 3A-B, and 4A-C). In an embodiment, the alternating layers of polysilicon and oxide may be substantially simultaneously trimmed using the plasma—i.e., the same plasma having a certain set of parameters may be used to trim each of the alternating layers of polysilicon and oxide. Such parameters may also allow the plasma etchant to trim the lateral edges of the alternating polysilicon and oxide layers of the etched 3D multilayer line, while minimizing or substantially eliminating vertical trimming of the etched 3D multilayer line, thereby increasing the ratio of the 3D multilayer line height to width of the resulting trimmed 3D multilayer line.

In an embodiment, the memory device 155 has a multilayer line 156 having eight alternating layers of each of oxide and polysilicon, for a total of 16 layers. Each of the alternating oxide and polysilicon layers has a thickness of approximately 600 Å, resulting in a total height for the multilayer line 156 in the range of approximately 3200-6400 Å. In an embodiment, the total height is approximately 4800 Å. An etching layer in the range of approximately 200-400 Å is used to trim the multilayer lines. In other embodiments, the memory device 155 has a multilayer line 156 having a total of 4, 8, 16, or more layers.

In some embodiments, the width 151 of the multilayer line 156 will have a slight variation from the top portion to the bottom portion of the multilayer line 156. For example, in an embodiment, the critical dimension width of a top portion of the multilayer line 156 is approximately 25 nm, and the critical dimension width of a bottom portion of the multilayer line 156 is approximately 45 nm. In other embodiments, the critical dimension width of a top portion of the multilayer line 156 is in the range of approximately 20-30 nm, and the critical dimension width of a bottom portion of the multi layer line 156 is in the range of approximately 40-50 nm.

As shown in FIG. 5, the memory device 155 may include a plurality of the trimmed 3D multilayer lines.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method for forming a multilayer line of a memory device, the method comprising:
   placing an etched multilayer line having alternating layers of polysilicon and oxide in an etching chamber; and
   trimming the etched multilayer line using a plasma having a bias power in the range of substantially 0 W and a ratio of $O_2$ to $CF_4$ in the range of approximately 0-20.

2. The method of claim 1, wherein prior to placing the etched multilayer line in the etching chamber, forming the etched multilayer line by:
   providing a substrate;
   forming alternating layers of polysilicon and oxide on the substrate;
   forming a secondary oxide layer over the alternating layers of polysilicon and oxide;
   forming an advanced patterning film (APF) layer over the secondary oxide layer;
   forming a SiON layer over the APF layer;
   forming a BARC layer over the SiON layer;
   forming a photo resist layer over the SiON layer; and
   patterning the photo resist layer based on a desired etched multilayer line profile.

3. The method of claim 2, wherein the forming the etched multilayer line further comprises:
   etching the APF and SiON layers using the patterned photo resist layer; and
   removing the patterned photo resist layer.

4. The method of claim 3, wherein the forming the etched multilayer line further comprises etching the alternating layers of polysilicon and oxide forming the etched multilayer line.

5. The method of claim 4, wherein trimming the etched multilayer line using the plasma further comprises generating a trimmed multilayer line having a height and a width, wherein the ratio of the height of the trimmed multilayer line to the width of the trimmed multilayer line is in the range of approximately 12-17.

6. The method of claim 4, wherein trimming the etched multilayer line using the plasma further comprises trimming the alternating layers of polysilicon and oxide substantially simultaneously.

7. A method for forming a semiconductor memory device, the method comprising generating a trimmed multilayer line by substantially simultaneously trimming alternating layers of polysilicon and oxide of an etched multilayer line using a plasma;
  wherein the plasma has a bias power in the range of substantially 0 W and a ratio of $O_2$ to $CF_1$ in the range of approximately 0-20.

8. The method of claim 6, wherein trimming the alternating layers of polysilicon and oxide comprises trimming the lateral edges of the alternating polysilicon and oxide layers of the etched multilayer line.

9. The method of claim 6, wherein trimming the alternating layers of polysilicon and oxide of the etched multilayer line comprises vertical trimming in the range of approximately 10-15 nm of the etched multilayer line.

10. The method of claim 6, wherein the etched multilayer line has a first height and a first width, and wherein the trimmed multilayer line has a second height and a second width, and wherein a first ratio of the first height to the first width is less than a second ratio of the second height to the second width.

11. The method of claim 6, wherein the second ratio is in the range of approximately 12-17.

12. The method of claim 6, wherein substantially simultaneously trimming the alternating layers of polysilicon and oxide comprises etching the alternating layers of polysilicon and oxide at substantially the same etching rate resulting in the etched multilayer line having substantially smooth sidewalls.

* * * * *